(12) United States Patent
Tsironis

(10) Patent No.: US 9,664,718 B1
(45) Date of Patent: May 30, 2017

(54) HIGH SPEED HYBRID ACTIVE LOAD PULL

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 14/837,242

(22) Filed: Aug. 27, 2015

Related U.S. Application Data

(60) Provisional application No. 62/042,550, filed on Aug. 27, 2014.

(51) Int. Cl.
  *G01R 27/06* (2006.01)
  *G01R 27/28* (2006.01)

(52) U.S. Cl.
  CPC ............ *G01R 27/06* (2013.01); *G01R 27/28* (2013.01)

(58) Field of Classification Search
  USPC .......... 324/638, 601, 750.01, 537, 612, 629, 324/637, 252, 600, 605, 614, 750.16, 324/76.22, 642, 655; 333/17.3, 263, 17.1, 333/32, 642, 248; 340/5.61, 5.64
  See application file for complete search history.

(56) References Cited

U.S. PATENT DOCUMENTS

| | | | |
|---|---|---|---|
| 6,509,743 B1 | 1/2003 | Ferrero | |
| 6,639,393 B2 | 10/2003 | Tasker | |
| 6,674,293 B1 | 1/2004 | Tsironis | |
| 6,812,714 B2 | 11/2004 | Verspecht | |
| 7,486,067 B2 | 2/2009 | Bossche | |
| 8,497,689 B1 | 7/2013 | Tsironis | |
| 2011/0204906 A1* | 8/2011 | Tsironis | G01R 29/0878 324/750.01 |

OTHER PUBLICATIONS

Load Pull Measurements, http://en.wikipedia.org/wiki/Load_pull.
"Computer Controlled Microwave Tuner—CCMT," Product Note 41, Focus Microwaves Inc., Jan. 1998.
"Overcoming Nonlinear Measurement Challenges", Application Note, Tektronix Corp, 2009.
Microwave power dividers and combiners; Wikipedia: http://en.wikipedia.org/wiki/Power_dividers_and_directional_couplers.
Network Analyzer: http://www.home.agilent.com/en/pd-867173-pn-N5242A/pna-x-microwave-network-analyzer?&cc=CA&lc=engPNA-X.
Network Analyzer: http://www.rohde-schwarz.com/en/product/zva-productstartpage_63493-9660.html.
"MPT, a universal Multi-Purpose Tuner", product note 79, Focus Microwaves, Oct. 2004.

* cited by examiner

*Primary Examiner* — Melissa Koval
*Assistant Examiner* — Nasima Monsur

(57) ABSTRACT

A high speed tuning and measuring algorithm is used for production level testing on-wafer a large number of chips. It applies to a hybrid active injection load pull test system. Using a pre-calibration of the passive tuner and the amplitude and phase settings of the active power injection signal and employing fast harmonic receiver VNA the test system is capable of executing frequency and time domain load pull measurement sets including more than 50 impedance points in a total of 1 second for quantities such as delivered input and output power, PAE, power gain and other. Overall test time, including device hoping and biasing on the automatic probe station is less than 1.5 seconds. This enables production level load pull operations.

3 Claims, 11 Drawing Sheets

HIGH SPEED HYBRID ACTIVE LOAD PULL

PRIORITY CLAIM

This application claims priority on provisional application 62/042,550, filed on Aug. 27, 2014, titled "High Speed Hybrid Active Load Pull".

CROSS-REFERENCE TO RELATED ARTICLES

1. Load Pull: Wikipedia: http://en.wikipedia.org/wiki/Load_pull
2. "Computer Controlled Microwave Tuner—CCMT", Product Note 41, Focus Microwaves, January 1998.
3. "Overcoming Nonlinear Measurement Challenges", Application Note, Tektronix Corp, 2009.
4. TSIRONIS Christos, U.S. Pat. No. 8,497,689; "Method for reducing power requirements in active load pull system"
5. Microwave power dividers and combiners; Wikipedia: http://en.wikipedia.org/wiki/Power_dividers_and_directional_couplers
6. FERRERO Andrea, U.S. Pat. No. 6,509,743; "Active load or source impedance synthesis apparatus for measurement test set of microwave components and systems"
7. Network Analyzer: http://www.home.agilent.com/en/pd-867173-pn-N5242A/pna-x-microwave-network-analyzer?&cc=CA&lc=engPNA-X
8. Network Analyzer: http://www.rohde-schwarz.com/en/product/zva-productstartpage_63493-9660.html
9. VANDEN BOSSCHE Marc, U.S. Pat. No. 7,486,067; "Real-time device characterization and analysis"
10. TASKER Paul Juan, U.S. Pat. No. 6,639,393; "Methods and apparatus for time-domain measurement with a high frequency circuit analyzer"
11. VERSPECHT Jan, U.S. Pat. No. 6,812,714; "Apparatus for collecting signal measurement data at signal ports of an RF and microwave device-under-test, under different impedance load conditions"
12. "MPT, a universal Multi-Purpose Tuner", product note 79, Focus Microwaves, October 2004.
13. TSIRONIS Christos, U.S. Pat. No. 6,674,293; "Adaptable pre-matched tuner system and method"

BACKGROUND OF THE INVENTION

This invention relates to testing and characterization of microwave high power transistors and amplifiers (device under test, DUT); the test system disclosed here allows for high volume, high speed production testing chips on wafer through acquisition and processing of its RF characteristics, typically gain, output power, efficiency, inter-modulation etc, under precise source and load impedance at the fundamental and harmonic frequencies (see ref. 1); reflection factors Γ up to and exceeding |Γ|=1. The complex RF impedance Z=R+jX relates to the complex reflection factor Γ as follows: $\Gamma = |\Gamma|^* \exp(j\Phi) = (Z-Zo)/(Z+Zo)$, whereby Zo=50Ω is the typical characteristic impedance of the transmission lines, cables and input/output instrument impedances in the system.

DESCRIPTION OF PRIOR ART

Traditional passive load pull systems (FIG. 1) comprise a signal source (1), which typically also includes a driver amplifier, an input impedance tuner (2) a DUT (Device Under Test) in a test fixture (3), an output impedance tuner (4) and a microwave power sensor (5). The injected power is measured at a coupled port (6) at the input and the output power at the power meter (sensor) (5). Additional components, such as bias tees, attenuators, filters and couplers, as well as instruments such as power supplies and spectrum analyzers are also used but do not change the basic concept. The DUT's characteristics are measured as a function of source and load impedances generated by the tuners (2) and (4) at the operating (fundamental, Fo) and a number of harmonic frequencies (2Fo, 3Fo, . . . ). The total is controlled by a system computer (11), which controls the tuners (2, 4) using digital cables (7, 8) and communicates (9, 12) with the instruments (5) for configuring, triggering and data acquisition (see ref. 1, 3, 9, 10 and 11).

The reflection factors (20) created by the impedance tuners cover, typically, the largest part of the reflection factor plan (Smith chart), (21), FIG. 2; appropriate tuning and interpolation algorithms (see ref. 2) allow synthesizing almost every impedance within the effective tuning range (32) at the DUT port (FIG. 3); the effective tuning range at the DUT ports is reduced, compared with the "tuning range at tuner port" (33) because of the insertion loss between DUT and tuner (segments (10) and (12) in FIG. 1); therefore the actual tuning capacity of such a "passive" tuner system is shown in FIG. 3 as "tuning range at DUT port" (32). However, many power transistors (DUT) need to be power matched at impedances shown as dots (30) or (31). In the first case a minimization of the test fixture and interconnection loss (10, 12) might allow the tuner to reach this point (30). But in many other cases, like in the case of dot (31), this is simply impossible using a passive system as shown in FIG. 1. In this case an "active" solution is necessary. This is shown in FIG. 4; in this case, on top of the original signal (41) an additional signal (42), coherent with the signal delivered by the DUT at its output port (Pdut), is injected (Pinj) and its phase and amplitude are adjusted in order to be properly added to the signal Prefl, reflected at the passive tuner (47) and generate an enhanced virtual load, which corresponds to a total reflection factor larger than the reflection factor generated by the passive tuner alone (Prefl) (see ref. 4, 5). This type of load pull setup is called a "hybrid open loop" system, because it uses passive tuners and independently injected coherent signal.

Hitherto open-loop active (and hybrid) injection load pull systems (see ref. 6) employ a harmonic receiver (network analyzer, VNA), (40) which has at least two coherent (or synchronized) internal signal sources (41) and (42), which generate a signal at the operation frequency (Fo) also called "fundamental" frequency of which the relative amplitude and phase can be controlled and adjusted by the operator using appropriate commands. Their relative phase and amplitude remain constant during a power reading at the receiver detectors D1 and D2 (see ref. 7, 8). Some of those harmonic receiver analyzers have more than two internal signal sources which can be adjusted to generate also harmonic coherent signals (see ref. 7, 8). The main signal (41) is injected into the input port of the DUT (43) via a signal boosting amplifier (44) and a electromechanical slide screw impedance tuner (45) and traverses a low loss directional coupler (46); the coupled ports of the coupler are connected to a reference (R1) and a measurement (D1) detectors of the VNA and allow to measure the travelling power waves a1 and b1 and thus the injected power into the DUT and its internal input impedance. The injected power at the DUT input port is defined as $Pin=|a1|^2$ (eq. 1) and the input impedance (reflection factor Γdut) as: Γdut=b1/a1 (eq. 2). The power delivered from the output of the DUT to the load is defined as Pdut=|b2|² (eq. 3) and the total reflection factor seen by the DUT at its output port is Γload=a2/b2 (eq. 4). In fact the total power injected into the output port of the DUT from the load is: Ptotal=Prefl+Pinj (eq. 5), whereby Prefl is the power reflected at the passive tuner (47) and Pinj is the power coming from the second source (42) after being amplified by the amplifier (48). The output of the amplifier (48) is protected using a circulator (49) which has its third port terminated (401), operating thus as an isolator. Since Pinj can be adjusted in amplitude and phase a condition can be reached, whereby the reflected power Ptotal is equal to or higher than the power generated by the DUT, thus resulting in a total reflection factor Gamma (Γtotal) which can reach 1 (|Γtotal|≤1) or be even higher than 1 (|Γtotal|>1) (eq. 6); this is the purpose of the active injection tuning.

The advantage of the hybrid (passive & active) system is that, through the transformation of the 50 Ohm internal impedance of the power amplifier (48) towards the low DUT output impedance through the output tuner (47), the requirement for injected power (Pinj) at the fundamental frequency Fo required to reach |Γ|=1 is reduced by a factor of 10 to 20, compared with the case where tuner (47) is not used, and, if the output tuner (47) is a harmonic tuner (see ref. 12), then independent passive harmonic tuning can be added to the fundamental combined (passive & active) tuning (see refs. 12 and 13). However, since the load reflection factor depends on the power generated by the DUT, the system cannot be used previously calibrated. The system must be "on line": it requires iterative real-time synthesis of each impedance through "reading" and "correcting" the power waves b2 and a2 at each movement of the tuner and each change of the amplitude or phase of the injected power. The reason for this difficulty lies in the fact that all power waves change, when the injected power changes, because the reaction of the device to the changing load is part of the synthesized impedance: Pdut is generated by the DUT as a reaction of the load impedance presented to it. The flowchart in FIG. 5 shows, schematically, a possible iterative tuning process. This invention discloses a calibration and high speed measurement method for active injection load pull, which is much faster than existing methods and is appropriate for high volume production testing.

BRIEF DESCRIPTION OF THE DRAWINGS

The invention will be better understood through the Figures included as follows.

DETAILED DESCRIPTION OF THE INVENTION

The test setup discussed here is meant to be used in mass testing on semiconductor wafers; i.e. the DUT are chip transistors or monolithic integrated circuit (MMIC) amplifiers manufactured on a semiconductor wafer and shall be individually load-pull tested in-situ, i.e. before they are sectioned, separated and individually packaged. The chip-devices are designed and supposed to be identical, which in praxis means that they largely have very similar or identical DC and RF behavior. Therefore the proposed method employs testing all chips for, nominally, the same set of load and source impedances. We are using the expression "nominally" since, as already discussed, the actual Γload depends also on the power delivered by the DUT: that is, even if the injected power into the DUT (Pinj) is the same, Γload may be slightly different each time another DUT is tested; this happens if the gain of the DUT changes, i.e. the original input power may generate a different output power (b2). This is though not critical, because the actual Γload=a2/b2 is measured in real time and the association Output power, Gain etc. with the actual Γload is going to be accurate, even though the actual Γload may change. The devices are mounted on fully automatic wafer probe stations which are remotely controlled by a central computer; the devices are accessed through probing, i.e. the microwave probes, or rather the wafer, which is placed on the mobile chuck of the station, is positioned at precise coordinates and lifted, in such a way that the probes make reliable contact with each individual device one after the other very rapidly in a "device hopping" process, after which each device is automatically biased to given bias conditions using remotely controlled and sensed DC bias supplies. Once this is made the actual load pull test procedure for each individual chip starts.

Figure 1:
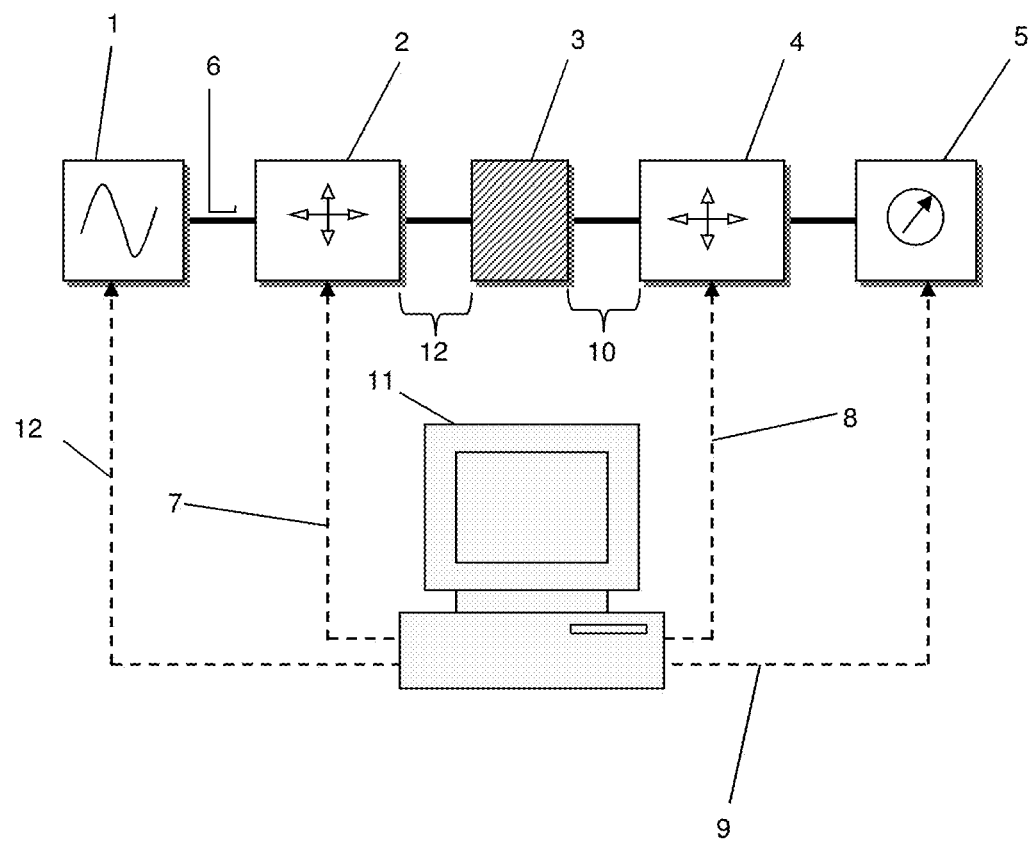
FIG. 1 depicts prior art, a typical automated load pull test setup using passive (electromechanical or electronic) tuners only.
Figure 2:
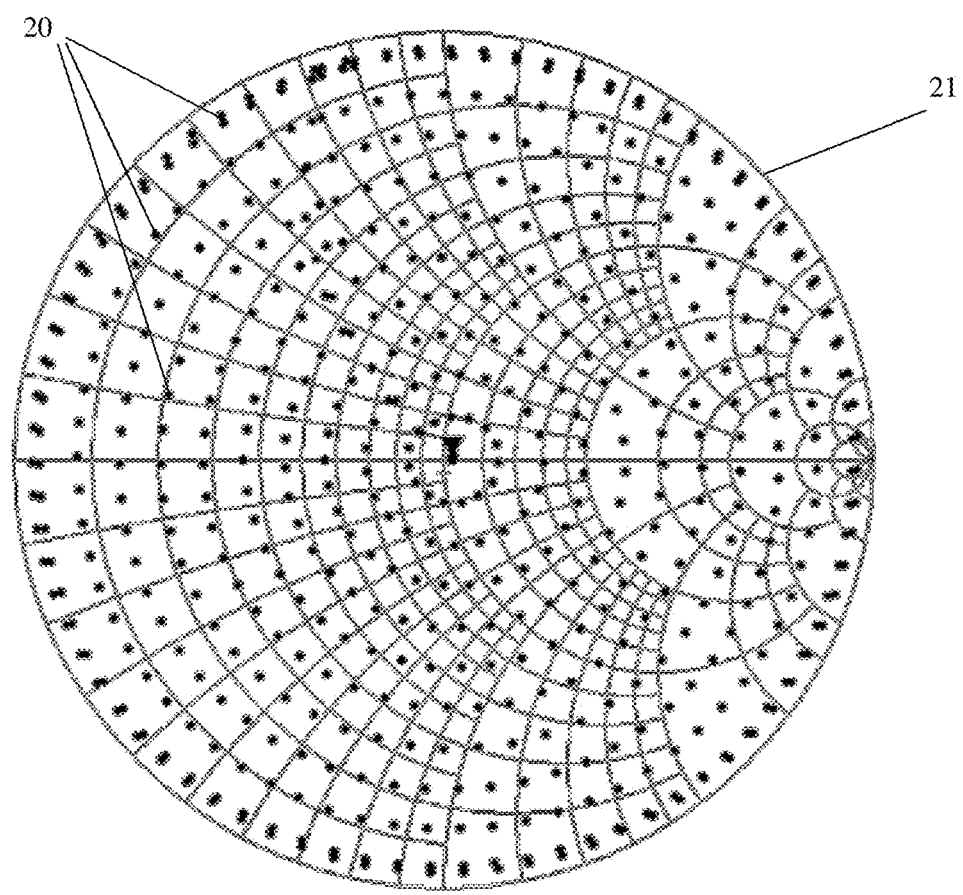
FIG. 2 depicts prior art, the distribution of calibration points in passive slide screw tuners on the Smith chart.
Figure 3:
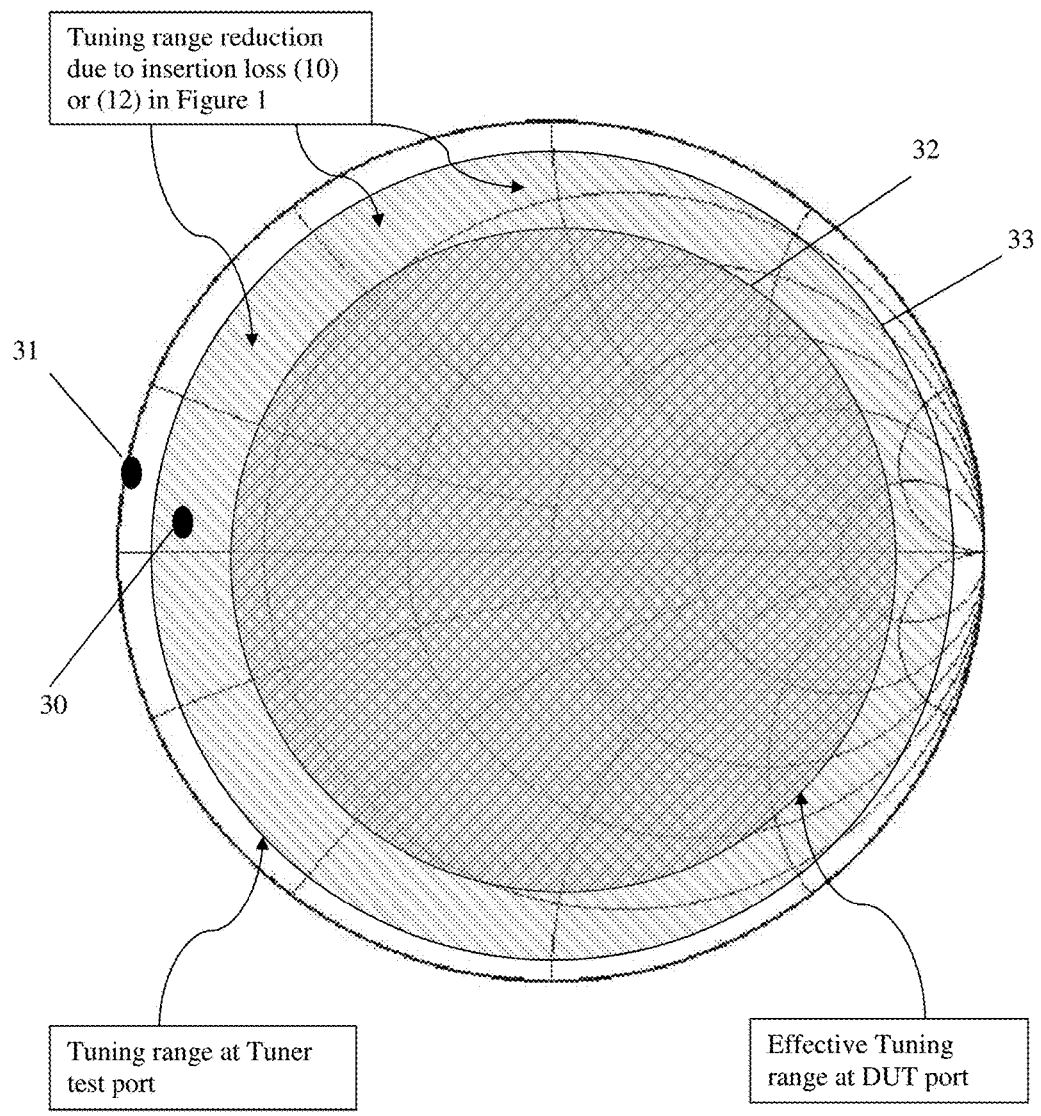
FIG. 3 depicts prior art, the reduction of tuning range of passive tuners due to insertion loss between the tuner and the DUT.
Figure 4:
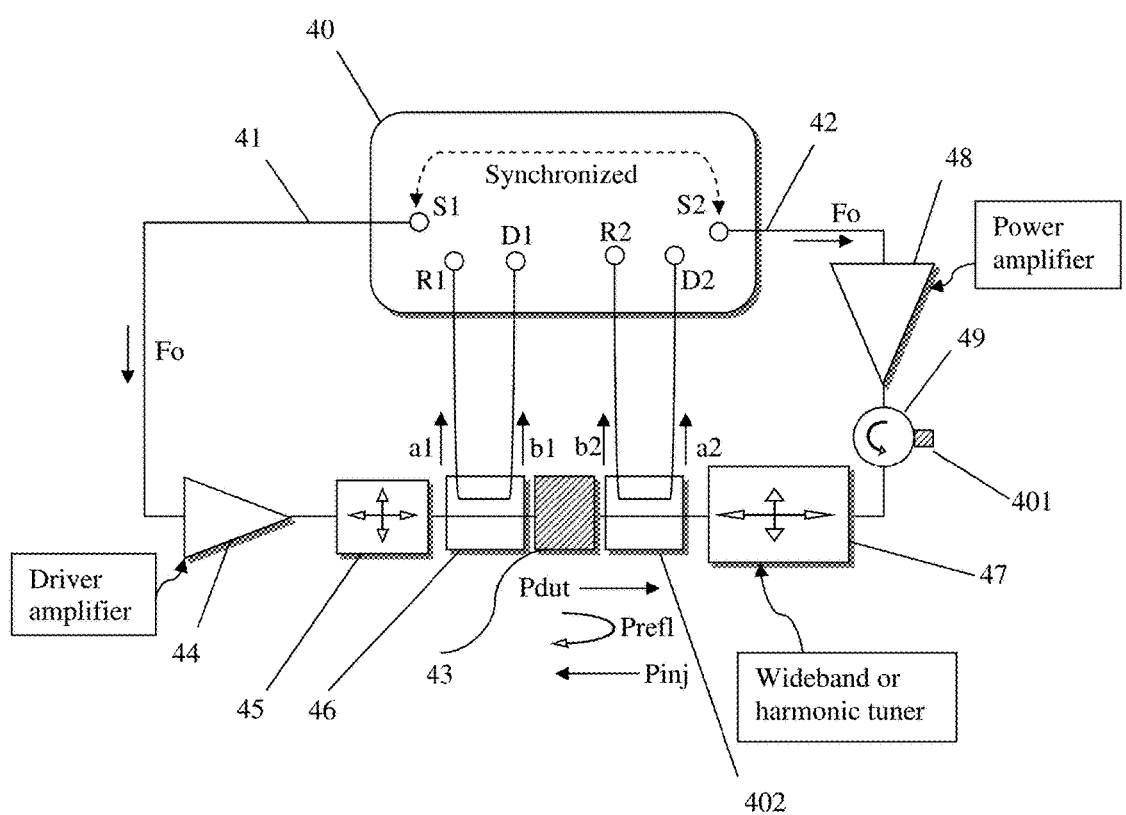
FIG. 4 depicts prior art, a block diagram of a hybrid open loop active injection load pull setup and the associated nomenclature. This setup allows active injection at the fundamental frequency (Fo) and the possibility of passive harmonic tuning, when a passive harmonic tuner (47) is used.

The active injection setup used is shown in FIG. 4. It comprises the wideband harmonic receiver, having a signal output at the fundamental (operating) frequency Fo followed by a power driver amplifier (44) boosting the signal. The amplified signal enters into the input impedance tuner (45) and through the tuner to a low loss directional coupler (46) and then into the DUT's (43) input port. The signal exits the DUT at its output port; a small portion of the injected and extracted signal is sampled by the coupled branches of the couplers (46) and (402) and injected into the test ports of the receiver (40), whereby the R detectors serve as reference and the D detectors as measurement sensors of the associated injected and reflected traveling power waves a1, a2 and b1, b2, whereby a1 and a2 propagate towards the DUT and b1 and b2 propagate from the DUT.

Figure 5:
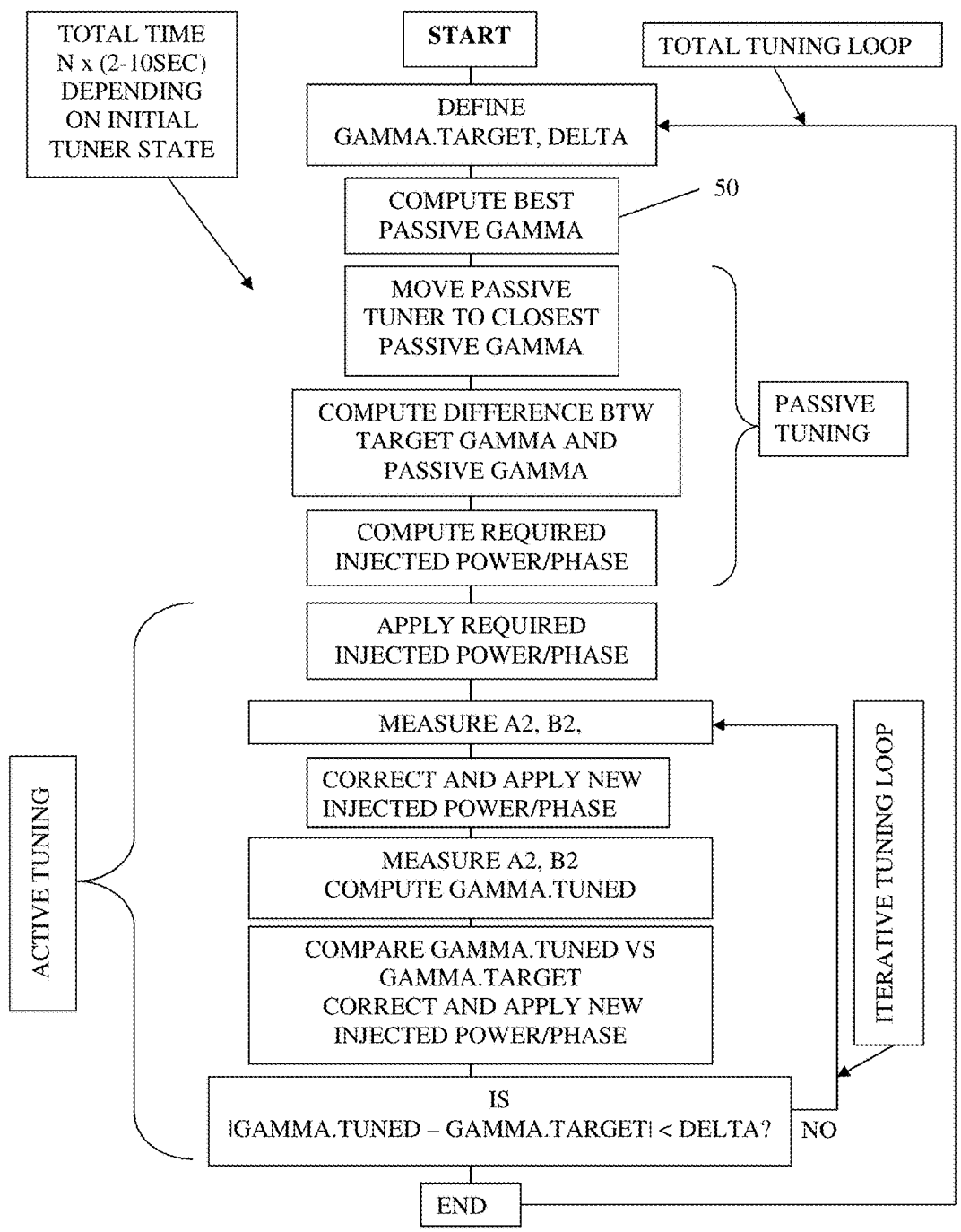
FIG. 5 depicts prior art: standard passive-active combined tuning algorithm of the hybrid active injection system implemented in the test setup of FIG. 4.

The test system can tune source and load impedances; i.e. it can generate any reflection factor required to test the DUT; the process for doing this is hereby called the tuning algorithm of which the flow-chart is shown in FIG. 5: After a target reflection factor Gamma is defined (either by the user manually, or in an automatic, script based, test procedure, where target Gamma is defined as part of a pattern in a loop), the processor calculates the closest passive tuning Gamma for minimum active injection power (Pinj in FIG. 4); this is typically a vector of the same or very similar direction as the Target-Gamma; the amplitude of the passive Gamma is computed as the best compromise between the proximity of passive Gamma to Target-Gamma and the tuner loss (the closer the passive tuning is to the target, the less injected power is needed—in the extreme case where the passive Gamma is equal to the target, no injected power is needed), at the same time, though, the higher the passive Gamma, the higher the tuner loss, which reduces the effect of Pinj, or more Pinj will be needed; there is always a tuner state at which the gain in Pinj from reducing the mismatch between passive Gamma and Gamma target is cancelled by the inherent tuner loss, which increases with increasing passive Gamma. This calculation provides the "best passive Gamma" (50) as shown in FIG. 5. After that the tuner probe is moved mechanically to the found position. This takes from a few seconds up to fractions of a minute, depending on the previous mechanical position of the tuner probe.

The entire procedure disclosed further-on presumes that the passive input tuner (45) is set to a fixed position found to represent the optimum impedance matching of the DUT at the input, or as close to this condition as the tuning range of the tuner (45) allows, reduced by the insertion loss of the coupler (46) and the input section of the test fixture (43), see FIG. 4, applied at the device input. Source tuning is considered optimum within the capacity of the test system and constant and is not discussed further. This invention concerns load tuning only.

Figure 7:
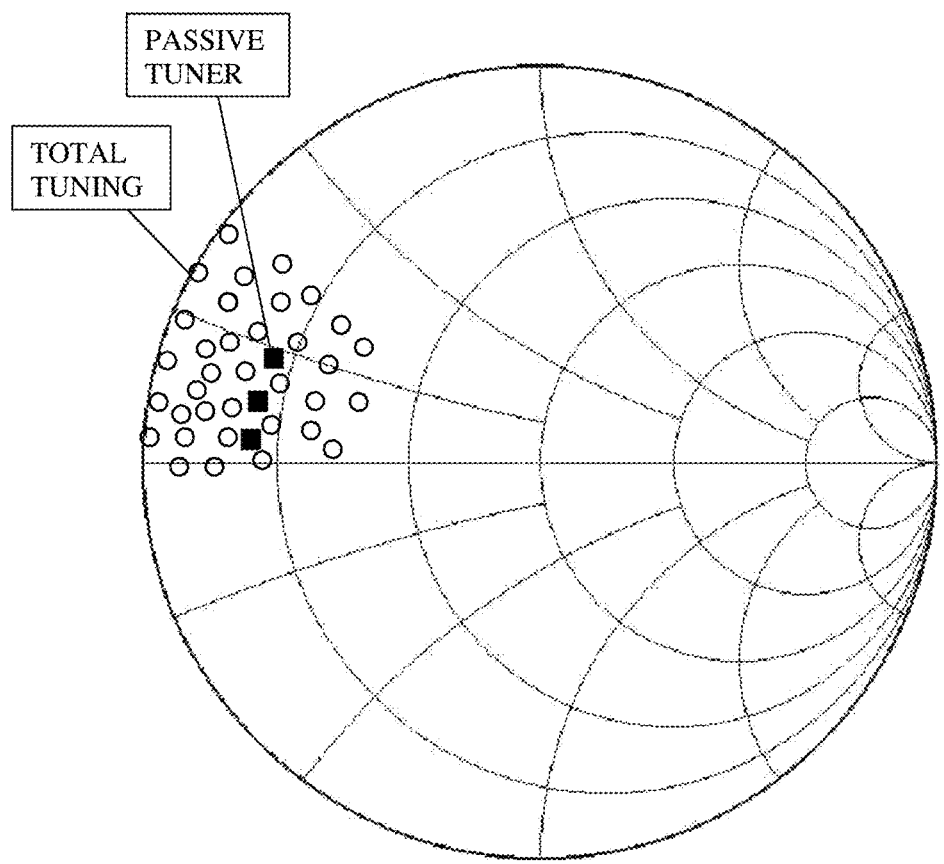
FIG. 7 depicts a set of typical impedances tuned during hybrid load pull operation using passive tuning and active injection resulting in total tuned reflection factors. It is remarked that active injection may reduce the reflection factor, depending on the phase of the injected signal.
Figure 8:
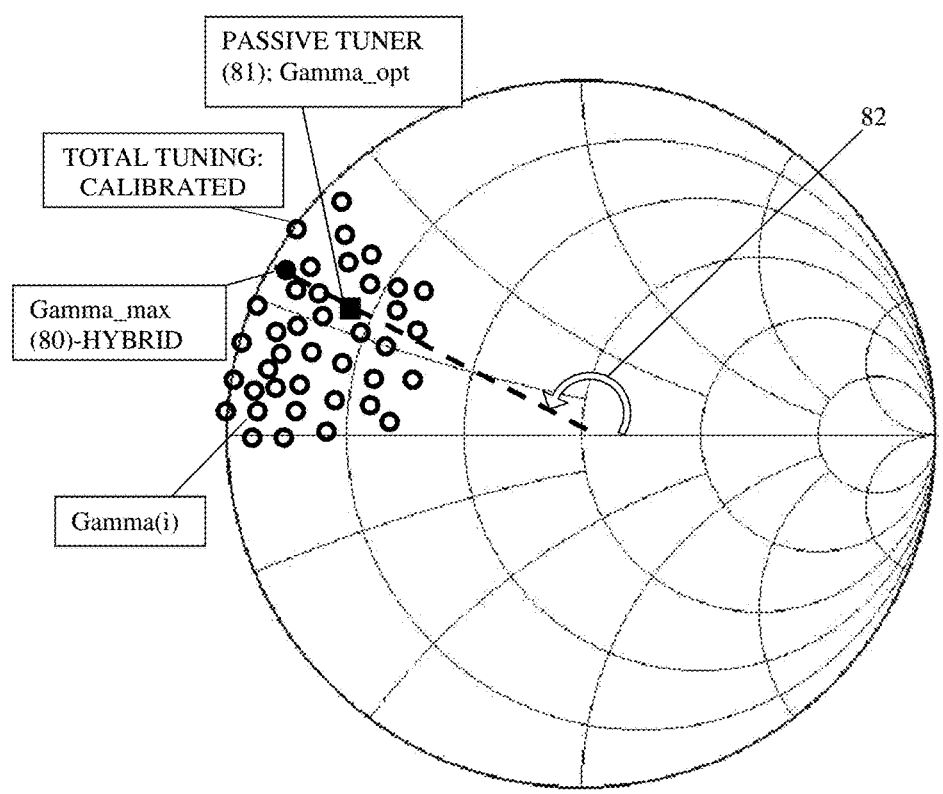
FIG. 8 depicts the calibrated points determined using a single passive tuning state and several active injection states following the algorithm of FIG. 6.

This (prior art) tuning process is shown in FIG. 7 for a typical example of a hybrid load pull pattern. The small circles show the final tuning points, which can reach |Gamma|=1. It shows also the associated passive tuning points (small rectangles). Theoretically for each tuned point a different optimum passive tuning point could be found and used. But this would slow the process further, since the mechanical movement of the passive tuner costs time, beyond the fact that, even if two passive points of the Smith chart are adjacent, the passive tuner may have to go around a whole circle ($\lambda/2$) to reach the next point. This happens if the next point is beyond the calibration phase of the tuner, in which case the probe must move one half of a wavelength to reach the next point. Therefore in the procedure proposed here the passive tuner is kept fixed, even if this might entail slightly higher injected power, because of phase difference between the Target-Gamma and the passive Gamma; this is shown in FIG. 8. In general the passive tuning point is chosen to have the same or similar direction (angle 82) as the angle of the optimum load impedance (80).

Figure 10:
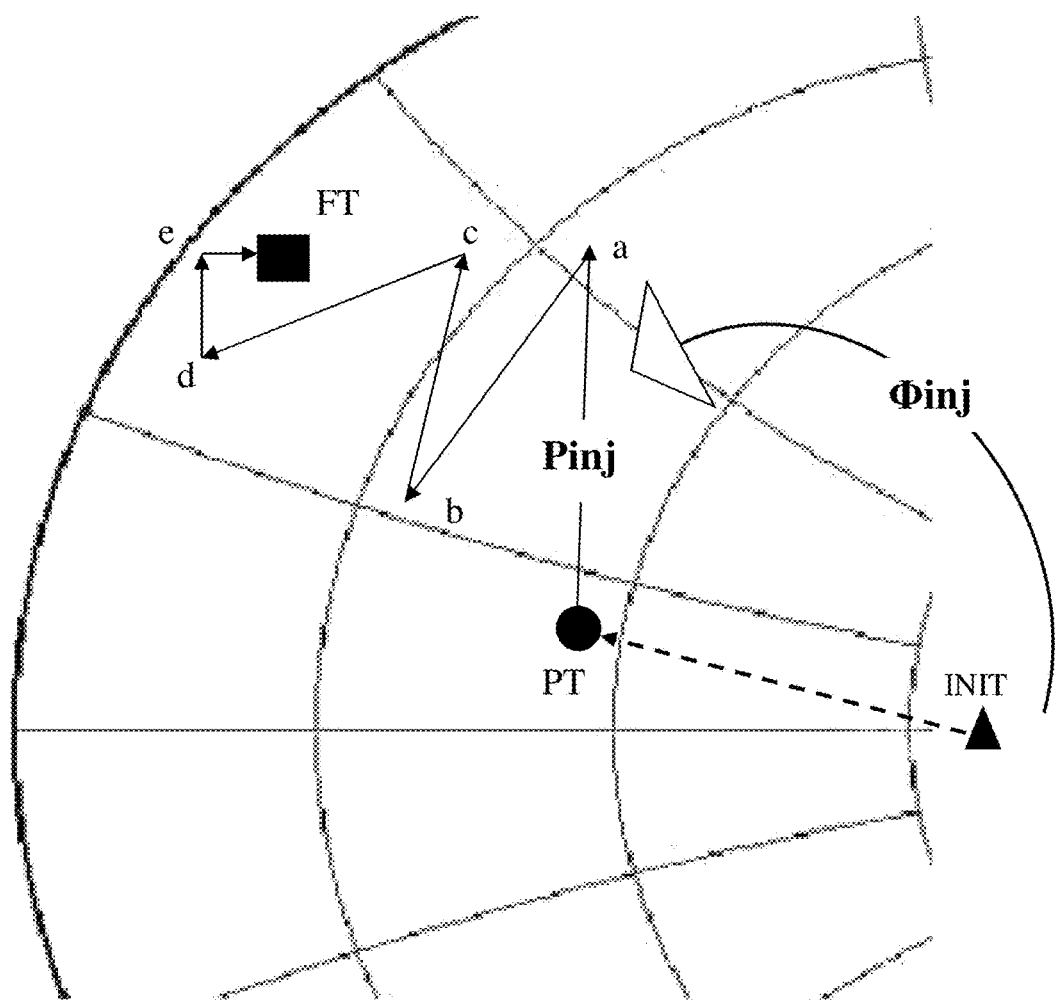
FIG. 10 depicts a typical trajectory of the gradient-based iterative active tuning algorithm in search of a final target point FT; starting from the initial position INIT, through the passive tuning state PT generated using the passive tuner.

But even if mechanical (passive) tuning is avoided, the electronic search algorithm itself also takes some time. The iterative process is shown in FIG. 10. In passive tuner operations (tuning), the main delay comes from final movement of the motors, i.e. iterative steps "INIT-PT-a-b-c-d-f", occur only in computer memory using pre-collected data, since the passive tuners are pre-calibrated and the data are simply loaded in memory and used. In electronic active tuning the procedure is different, because the power generated by the DUT (Pdut) affects the final reflection factor, which is unpredictable; this power (Pdut) depends on the load reflection factor Γload. Therefore after each tuning step the a2 and b2 must be measured (see FIG. 4) and appropriately corrected in an iterative gradient based process as shown in FIG. 10. The process of FIG. 10 works as follows:

i) Passive tuning is calculated for best compromise between injected power and tuner loss and the tuner is moved from point INIT (i.e. tuner probes withdrawn and output injection power Pinj turned off) to point PT (passive tuning);

ii) inject power with an initial random amplitude |Pinj| and phase Φinj;

iii) a2 and b2 are measured and Gamma is calculated: point (a): Γ (a);

iv) using Φinj and |Pinj| and comparing with the amplitude and phase of FT (final target) a correction proportional to the phase difference (Φa-ΦFT) and amplitude (|FT|−|Γ(a)|) is applied to the amplitude |Pinj| and Φinj;

v) a2 and b2 are measured again and Γ(b) is calculated: point (b);

vi) The steps (iv-v) are repeated leading from point Γ(b) to point Γ(c);

vii) The process continues with points (d), (e) etc. until the final tuning point FT is reached within a pre-defined tuning vector tolerance Delta=|Γ-FT|; typical Delta values used are 0.001 to 0.005;

It is immediately clear that, even if the electronic tuning is fast, the repetition of steps (iv) to (vii) of applying corrections to Φinj and |Pinj I and each time measuring a2 and b2 take time, which must be reduced to a minimum to maximize testing speed.

Figure 6:
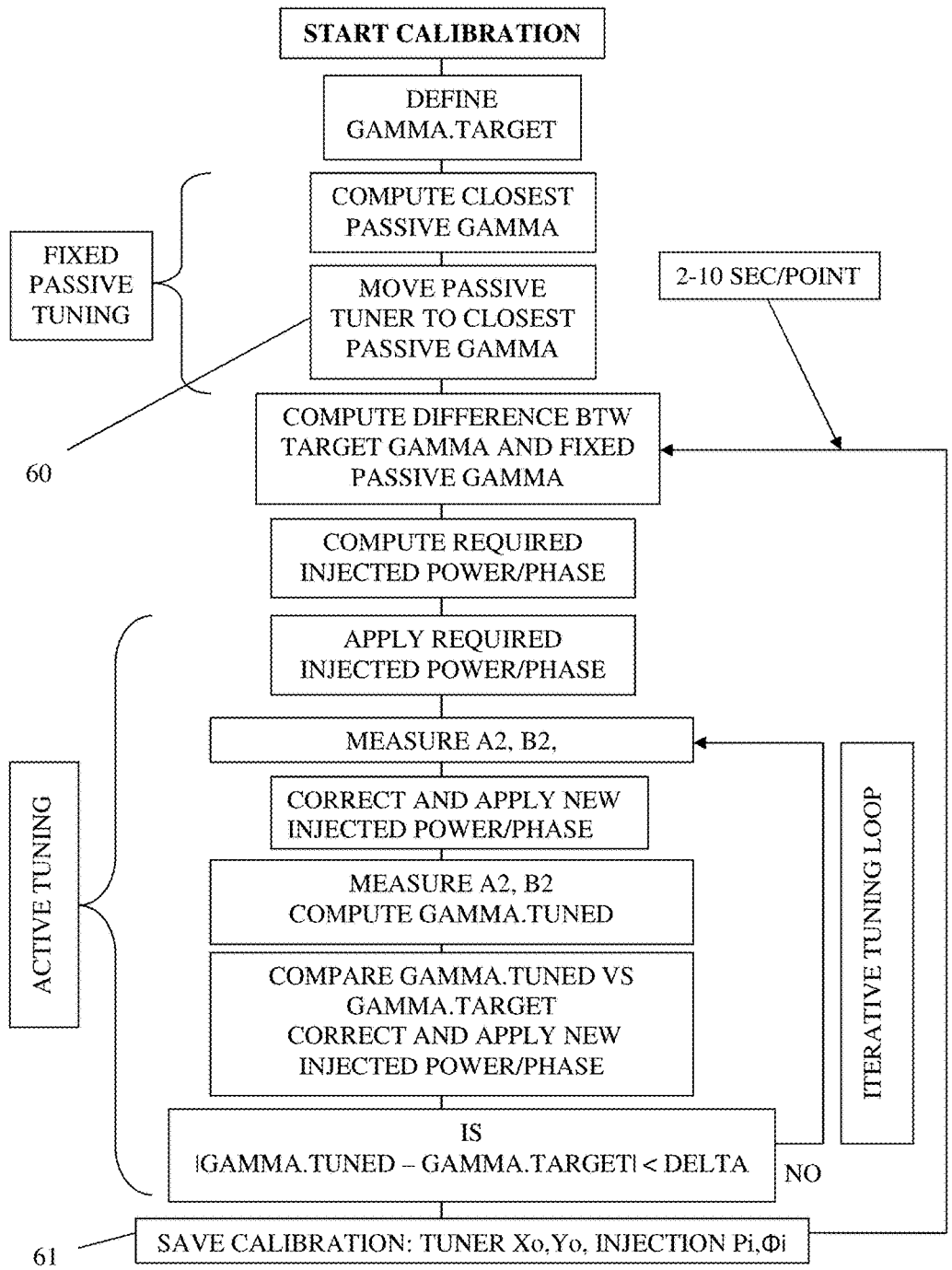
FIG. 6 depicts the calibration algorithm used to determine and save the test settings of the tuner and active injection on the "typical" or "representative" DUT chip(s).
Figure 11:
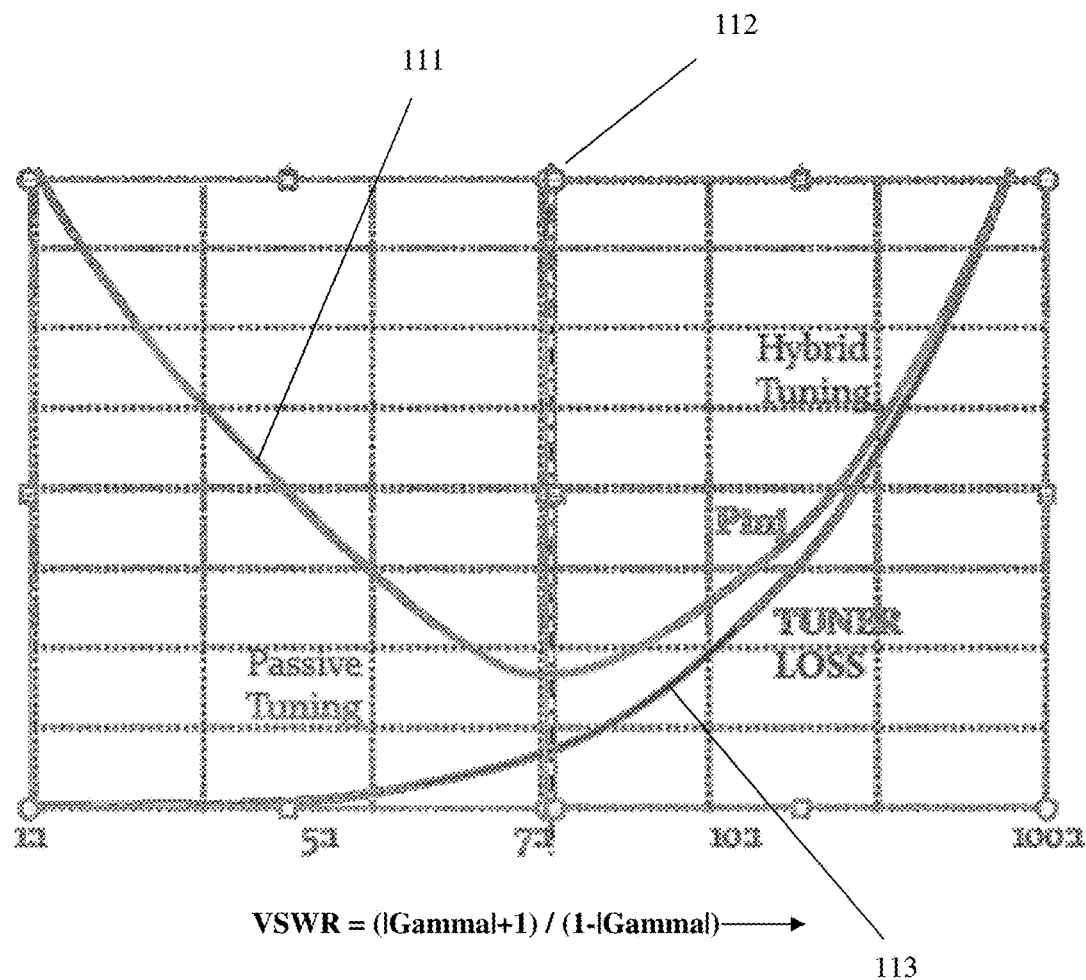
FIG. 11 depicts the relation between injected secondary power (Pinj) and tuner loss as a function of tuner VSWR (or reflection factor |Gamma|). VSWR varies from 1:1 (|Gamma|=0) to 100:1 (|Gamma|=0.98); optimum is approximately at VSWR≈7:1 (|Gamma|≈0.75).

In order to avoid these full scale tuning delays (steps iv to vii) a different approach is introduced. The routine is based on the assumption of repeated testing of similar or identical chip devices. In a production environment this is the case: hundreds or thousands of (nominally) identical chips are manufactured on each wafer. Therefore it can be expected that their RF behavior will be identical or very similar and by consequence also the required test conditions. The proposed procedure assumes this. Each Second gained in testing of the individual chip means Hours in total testing of a wafer. In a first step therefore a typical chip (or a few typical chips) is tested in a calibration run (FIG. 6). If more than one chip is sample-tested an average is calculated. This calibration algorithm differs from previous testing algorithms in that it only uses a single passive tuning state (60). All subsequent tuning steps are electronic through amplitude and phase corrections of the injected signal (Pinj). This is a trade-off between optimum power-matching through the passive tuner and tuning speed. The procedure excludes slow mechanical tuning. The passive input and output tuners are fixed; the output tuner is set to a position (81) at approximately the same angle (82) as the optimum point of the DUT (80) and a typical value, which by most experiments is shown to be approximately |Gamma_opt|≈0.75 (112); this reflection factor generated (Gamma_opt) is chosen experimentally to allow the matching reflection factor (Gamma_max) for the DUT to be synthesized using a minimum of injected power (111) into the output port of the DUT (FIG. 11). The optimum power matching reflection factor (Gamma_max) of the DUT is found through previous analysis of a general load pull run, in which an impedance spread over the whole Smith chart is applied, as shown in FIG. 5; the passive tuner then stays fixed. Gamma_opt is important, because it represents the best compromise between passive and active injection tuning (FIG. 11). The passive tuner (47) loss (113) increases the higher its Gamma, at the same time the required injected power decreases, but stepping over a threshold (Gamma_opt) the tuner loss increases faster than the increase in Gamma through injection and there is no gain, except need for higher injection power (42), (111). The optimum passive tuning versus minimum injected power represents the optimum hybrid system operation. All other tuning in FIG. 8 is done electronically very fast. For every tuned point the amplitude |Pinj| and phase Φinj of the injected power vector Pinj=|Pinj|*exp(jΦinj) is saved in an active tuning calibration file (61).

Figure 9:
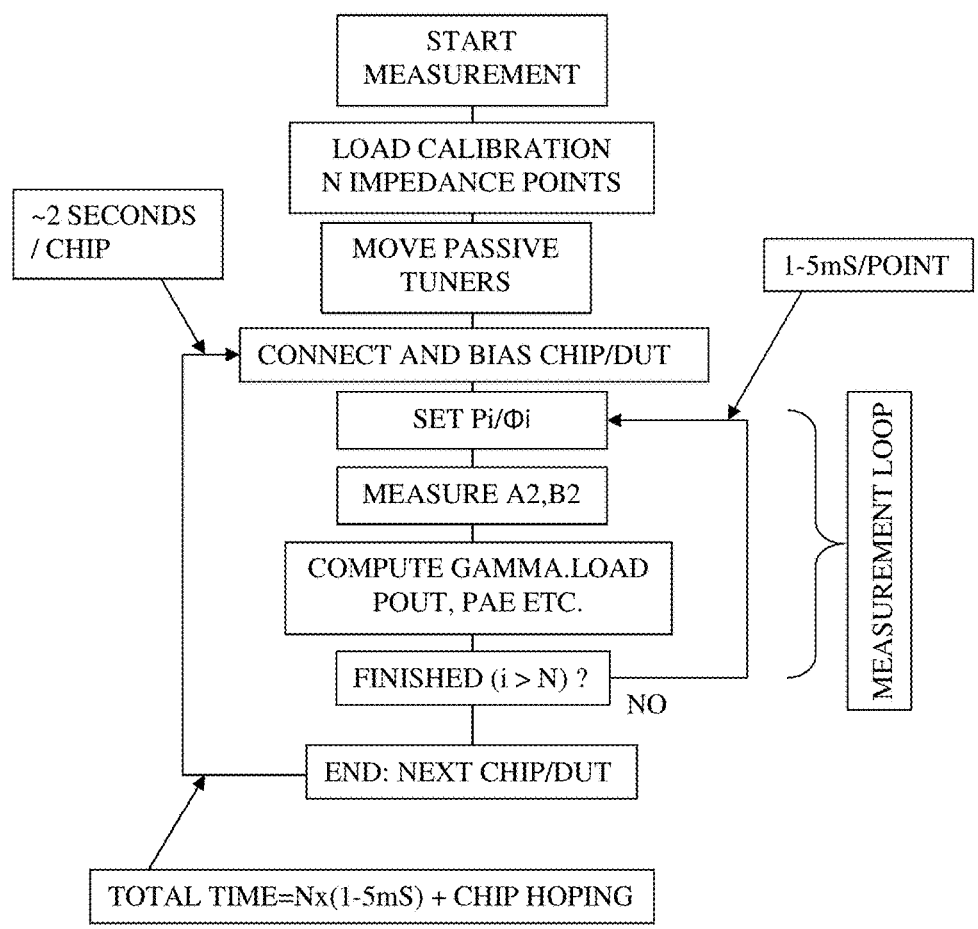
FIG. 9 depicts the accelerated tuning procedure using calibration data generated using the algorithm of FIG. 6.

The fast test procedure (FIG. 9) uses the calibration data in following steps:
 a) Load the calibration data from file; the file contains the positions of the input and output tuners and a multitude of amplitude |Pinj| and phase Φinj of the injected power and, optionally, the bias conditions;
 b) Set the passive input tuner to the point included in the calibration file; the tuner stays fixed;
 c) Set the passive output tuner to the point included in the calibration file; the tuner stays fixed;
 d) Connect the wafer-probes to the next chip and bias it;
 e) Start the load pull operation:
  i. Set amplitude and phase of the injected power retrieved from the calibration data;
  ii. Measure a1, b1, a2, b2 and save;
  iii. Go to next point, step (i);
  iv. Terminate when all impedance points are tested;
 f) Save data for the specific chip;
 g) Turn off bias off the chip and go to next chip, step d).

Usual delays of the above operations are: a) 0.5 seconds per probe hoping from one chip to the other; b) biasing the chip: 0.2 seconds; c) load pulling 50 points (<1 second). Total testing time around 1.5 seconds per chip compared to about 1 minute previously, or close to 40 times faster. For testing a complete wafer with 10,000 chips the new method needs approximately 4 hours. This is still lots of time but much faster than existing speeds of at least 100 to 150 hours per wafer.

It is clear that the above load pull procedure does not test the exact same impedances for each chip. Even though all settings are the same, the fact that individual chips are slightly different leads to slightly different load impedances, as explained before, because in Γload=a2/b2, whereas b2 is known, a2 depends on the individual device's gain and may change slightly. This is not relevant though, since the actual load impedances as well injected (b2) and delivered (a2) powers and DC bias conditions are measured by the power supply and the receiver rapidly for each device and in real time. Overall data evaluation and statistical analysis of the whole wafer is then done through post-processing software of collected data of the measured values saved on files for each individual chip.

This invention discloses a preferred embodiment of a new measurement method for hybrid load pull systems, which allows production level speed in testing load pull. Obvious alternative embodiments are imaginable but shall not impede on the originality of the described preferred embodiment.

What I claim as my invention is:

1. A method of performing a calibration step and a measurement step in a high speed load pull test system comprising a test setup, wherein the test setup comprises:
 a device under test (DUT);
 input driver;
 output power amplifiers;
 synchronized signal sources comprising a primary source and at least one secondary source, whereby the primary source injects power, through the input driver, into an input of the DUT, and the at least one secondary source injects power, through the output amplifiers, into an output of the DUT;
 an input and an output passive impedance tuner;
 low loss signal couplers inserted between the tuners and the DUT;
 an automatic wafer probe station, in which the DUT is mounted;
 a harmonic receiver;
 a control computer controlling the tuners, the test instruments and the probe station;
 said system allowing measurement of the incident and reflected power waves at the input and output ports of said DUT, sampled through the couplers and fed into the receiver test ports;
 whereby the calibration step comprises:
  a) source power matching using the input passive tuner;
  b) setting the output passive tuner to an optimum reflection factor for power matching the DUT at a fundamental frequency (Fo) using minimum secondary source power;
  c) active electronic tuning at Fo, comprising amplitude and phase control of the secondary signal source injected into the DUT output port, and
  d) saving settings of steps a) to c) as calibration data;
 whereby the measurement step comprises:
  e) only active electronic tuning at Fo to the calibrated points of step c) and
  f) measuring incident and reflected power waves at the DUT ports.

2. A test method as in claim 1, whereby the calibration step generates a multitude of predefined target load reflection factors Gamma(i) with a tuning accuracy Delta, comprising combined input and output passive tuner tuning and electronic active output tuning, for given DC bias conditions, in following steps:
 g) injecting input power and adjusting the input tuner (tuning) for obtaining maximum power gain of the DUT;
 h) adjusting the output tuner to reflection factor Gamma_opt, allowing reaching the expected optimum output matching condition of the DUT (Gamma_max) using the least injected power from the secondary source;
 i) saving in a calibration file the passive input and output passive tuner states, input power and DC bias conditions;
 j) iterative search-and-tune to Gamma(i), hereby adjusting the amplitude and phase of the injected secondary signal, using as a criterion the vector difference between Gamma(i) and the actually tuned Gamma, until a pre-defined tuning tolerance |Gamma-Gamma(i)|<Delta is reached;
 k) saving, for each Gamma(i), the secondary signal source amplitude and phase settings in the calibration file of step i);

l) continue with step j) until all Gamma(i) have been tuned to.

3. A load pull measurement method comprising the following steps:
- m) loading calibration data from calibration file generated in claim 2;
- n) injecting input power and directing the passive input and output tuners to the states saved in the calibration file;
- o) establishing RF/DC contact with the first chip on the wafer and DC biasing it;
- p) setting amplitude and phase of the secondary signal, for all Gamma(i) included in the calibration file;
- q) measuring and saving in a load pull data base incident and reflected power waves at the DUT input and output ports;
- r) continuing through steps p) and q) until all Gamma(i) are tuned to;
- s) go to step o) and continue with the next chip until all chips are tested and all data saved.

* * * * *